US010673202B2

(12) United States Patent
Rossbach et al.

(10) Patent No.: US 10,673,202 B2
(45) Date of Patent: Jun. 2, 2020

(54) LASER COMPONENT, USE OF A LASER COMPONENT, DEVICE HAVING LASER COMPONENT AND METHOD OF PRODUCING LASER COMPONENTS

(71) Applicant: OSRAM OLED GMBH, Regensburg (DE)

(72) Inventors: Georg Rossbach, Regensburg (DE); Hubert Halbritter, Dietfurt (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/112,615

(22) Filed: Aug. 24, 2018

(65) Prior Publication Data
US 2019/0067898 A1 Feb. 28, 2019

(30) Foreign Application Priority Data
Aug. 29, 2017 (DE) .................. 10 2017 119 778

(51) Int. Cl.
| | |
|---|---|
| *H01S 5/00* | (2006.01) |
| *H01S 5/42* | (2006.01) |
| *H01S 5/183* | (2006.01) |
| *G02B 27/42* | (2006.01) |
| *H01S 5/022* | (2006.01) |

(52) U.S. Cl.
CPC .......... *H01S 5/0085* (2013.01); *G02B 27/425* (2013.01); *H01S 5/005* (2013.01); *H01S 5/0071* (2013.01); *H01S 5/183* (2013.01); *H01S 5/18386* (2013.01); *H01S 5/423* (2013.01); *H01S 5/02228* (2013.01); *H01S 5/02288* (2013.01); *H01S 5/02292* (2013.01); *H01S 5/02296* (2013.01)

(58) Field of Classification Search
CPC ........ H01S 5/0085; H01S 5/183; H01S 5/423; H01S 5/005; H01S 5/0071; H01S 5/18386; H01S 5/02228; H01S 5/02288; H01S 5/02292; H01S 5/02296; G02B 27/425
See application file for complete search history.

(56) References Cited

U.S. PATENT DOCUMENTS

| | | | | |
|---|---|---|---|---|
| 5,073,041 A | * | 12/1991 | Rastani | ................... H01S 5/423 372/101 |
| 6,229,503 B1 | * | 5/2001 | Mays, Jr. | ............. G02B 27/017 345/7 |

(Continued)

FOREIGN PATENT DOCUMENTS

| | | |
|---|---|---|
| DE | 102005007601 A1 | 9/2005 |
| WO | 2009/115946 A1 | 9/2009 |
| WO | WO-2009115946 A1 * | 9/2009 ............. G01P 3/366 |

*Primary Examiner* — Xinning(Tom) Niu
(74) *Attorney, Agent, or Firm* — Arent Fox, LLP

(57) ABSTRACT

A laser component is provided which comprises: a surface emitting semiconductor laser configured to emit electromagnetic radiation along an emission axis, an optical element disposed downstream of the semiconductor laser along the emission axis, wherein the optical element comprises a diffractive structure, and a further optical element configured to cause radiation to be emitted asymmetrically with respect to the emission axis. Furthermore, the use of a laser component, a device having a laser component and a method for the production of laser components are provided.

18 Claims, 6 Drawing Sheets

(56) References Cited

U.S. PATENT DOCUMENTS

| | | | |
|---|---|---|---|
| 6,314,117 B1 * | 11/2001 | Heim | H01S 5/02212 257/433 |
| 2003/0032209 A1 | 2/2003 | Yeh et al. | |
| 2004/0218655 A1 * | 11/2004 | Tandon | H01S 5/3095 372/96 |
| 2006/0192221 A1 | 8/2006 | Zhou et al. | |

* cited by examiner

LASER COMPONENT, USE OF A LASER COMPONENT, DEVICE HAVING LASER COMPONENT AND METHOD OF PRODUCING LASER COMPONENTS

This application relates to a laser component, the use of a laser component, a device having a laser component and a method of producing laser components.

Semiconductor lasers typically radiate perpendicular or parallel to a surface on which they are mounted. For various applications, however, an oblique emission is favourable.

One object is to obtain an oblique emission, in particular in an especially compact and eye-safe manner.

Furthermore, a method is to be provided with which a semiconductor laser can be produced in a simple and reliable manner.

These objects are achieved, inter alia, by a laser component or by a method in accordance with the independent patent claims. Further embodiments and expediencies are subject-matter of the dependent patent claims.

A laser component is specified. In particular, the laser component is configured to emit electromagnetic radiation, especially in the visible, ultraviolet or infrared spectral range.

According to at least one embodiment of the laser component, the laser component has a surface emitting semiconductor laser which is configured to emit electromagnetic radiation along an emission axis. The semiconductor laser, for example, has a semiconductor layer sequence which comprises in particular an active zone that is configured to generate electromagnetic radiation. The emission axis runs in particular perpendicular to a main extension plane of the active zone. Thus, the emission axis runs parallel to a growth direction in the epitaxial deposition of the semiconductor layer sequence.

For example, the active zone is located in a resonator for the electromagnetic radiation to be emitted. For example, the semiconductor laser is a surface-emitting semiconductor laser, especially a VCSEL (Vertical Cavity Surface Emitting Laser). The semiconductor laser is especially electrically pumped. This means that the semiconductor laser can be excited to emit coherent radiation by applying an external electrical voltage.

According to at least one embodiment of the laser component, the laser component has an optical element which is arranged downstream of the semiconductor laser along the emission axis. In normal operation, a large part, i.e. at least 50%, in particular at least 90%, or the entire amount of electromagnetic radiation emitted by the semiconductor laser is incident on the optical element. For example, the optical element is configured to influence the electromagnetic radiation emitted by the semiconductor laser, in particular to shape it spatially. For example, the optical element is configured to focus, deflect, widen or adapt the radiation to a given emission profile. In particular, the optical element may be configured to split the radiation emitted by the semiconductor laser into several partial beams. The partial beams run obliquely to each other, so that the splitting into partial beams causes a widening of the radiation.

According to at least one embodiment of the laser component, the optical element has a diffractive structure. The diffractive structure is configured to affect the electromagnetic radiation emitted by the semiconductor laser by means of diffraction. For example, the diffractive structure comprises periodically arranged elements at which the electromagnetic radiation emitted by the semiconductor laser is diffracted. The elements can be arranged periodically especially along the lateral direction. A structural size of the elements along the lateral and/or vertical direction is in particular in the magnitude of the wavelength of the electromagnetic radiation emitted by the semiconductor laser measured in the material of the optical element, for example between including 0.1 times and including ten times, in particular between including 0.3 times and including three times a peak wavelength of the radiation emitted by the semiconductor laser.

For example, the elements can be regions having a refractive index different from the surrounding material.

According to at least one embodiment of the laser component, the laser component has a further optical element. The other optical element is especially configured to effect an asymmetric emission of the radiation of the laser component relative to the emission axis. In particular, the radiation emitted by the laser component is not axis-symmetrical and not rotationally symmetrical with regard to the emission axis of the surface-emitting semiconductor laser. For example, the laser component itself is already configured in such a way that the radiation emitted by the laser component has a main emission direction that runs obliquely, i.e. neither parallel nor perpendicular to the main extension plane of the active zone. In this case, the oblique emission does not require an optically effective element arranged downstream of the laser component.

The further optical element is, for example, a refractive element. A refractive element is based on refraction at interfaces between materials having different refractive indices.

In at least one embodiment of the laser component, the laser component comprises a surface-emitting semiconductor laser which is configured to emit electromagnetic radiation along an emission axis. The laser component further comprises an optical element and a further optical element, wherein the optical element is arranged downstream of the semiconductor laser along the direction of emission, wherein the optical element comprises a diffractive structure. The further optical element is configured to cause an asymmetric emission of the radiation with regard to the emission axis.

The laser component thus has two optical elements that can perform mutually different functions, for example a radiation widening by the optical element and a subsequent radiation deflection by the further optical element. In particular, the further optical element can exclusively have a radiation-deflecting effect. In contrast to this, the further optical element itself can also have a radiation-shaping effect, for example a radiation-widening effect.

According to at least one embodiment of the laser component, the main emission direction of the laser component is oblique to the emission axis of the semiconductor laser. For example, the emission axis and the main emission direction form an angle of at least 5°, at least 10° or at least 15°. For example, the surface-emitting semiconductor laser has an emission profile that is at least approximately rotationally symmetrical to the emission axis and has a Gaussian profile.

The direction along which the semiconductor component emits most of the radiation is considered as the main emission direction.

According to at least one embodiment of the laser component, the further optical element is arranged downstream of the optical element along the emission axis. The optical element is thus located between the semiconductor laser and the further optical element. The radiation emitted by the laser component passes first through the optical element and then through the further optical element before it leaves the semiconductor laser. In particular, the radiation can first be widened by the optical element and then tilted with regard to the emission axis of the semiconductor laser by the further optical element.

According to at least one embodiment of the laser component, the further optical element covers a side surface of the surface-emitting semiconductor laser in places. In particular, the further optical element can completely surround the optical element in the lateral direction. In other words, the further optical element encapsulates the optical element and/or the semiconductor laser. By means of the further optical element it is ensured in a simple manner that the optical element is not detached from the surface-emitting semiconductor laser. Thus, by having an optical element, which is intended, at least inter alia, to guarantee the eye-safety of the laser component, a high eye-safety can be easily achieved, especially in comparison to a laser component having an optical element which brings about the eye-safety and is arranged downstream of the laser component and thus in general can itself be detached from the laser component.

According to at least one embodiment of the laser component, the further optical element forms a side surface delimiting the laser component in the lateral direction. During production, such an additional optical element can be formed in a composite of several laser components and can be cut especially during the singulation of the composite. Thus, already during the singulation, the laser component contains the further optical element. After the singulation, a subsequent step for arranging a further optical element for beam-shaping, in particular for disturbing the symmetry of the emission, is therefore not necessary.

Accordingly, the further optical element can have traces of material removal on the side surface of the laser component. This material removal occurs during the singulation of the composite in which the laser components are located during production.

According to at least one embodiment of the laser component, the further optical element directly adjoins the optical element. In particular, the further optical element is adapted to the optical element. On the side facing the semiconductor laser, the further optical element at least partially follows the outer shape, i.e. the shape of the optical element facing away from the semiconductor laser. In particular, there is no bonding layer like an adhesive layer between the optical element and the further optical element.

According to at least one embodiment of the laser component, the optical element is a binary diffractive optical element. For example, a binary diffractive optical element can be produced by an etching method, wherein only an etching depth is required. Such a binary diffractive optical element is therefore particularly easy to produce, especially in comparison to multi-stage diffractive optical elements.

According to at least one embodiment of the laser component, a radiation exit surface of the further optical element facing away from the optical element is at least partially formed by a flat surface which extends obliquely to the emission axis of the semiconductor laser. In other words, the further optical element has the basic shape of a prism at least in places. Such an optical element is particularly easy to produce and causes the radiation emerging from the optical element to tilt so that the main emission direction of the laser component and the emission axis of the semiconductor laser run obliquely to one another. Alternatively or additionally, the radiation exit surface of the further optical element, however, may have at least one curved region.

According to at least one embodiment of the laser component, the further optical element is configured as Fresnel optics. A Fresnel optics surface typically has a plurality of jumps, where the Fresnel optics surface is not continuously differentiable. The gradient of the surface does not change continuously at the jumps. For example, the Fresnel optics is formed by a plurality of prisms arranged side by side along one lateral direction so that a radiation exit surface of the further optical element has a saw-tooth structure.

In particular, the following effects can be achieved with the laser component described here.

The further optical element is an element which is integrated into the laser component and forms an oblique main emission direction of the laser component. The optical element itself, on the other hand, can maintain the symmetry of the radiation emitted by the surface-emitting semiconductor laser or at least the main emission direction of the radiation along the emission axis.

A binary diffractive optical element is therefore particularly suitable as the optical element. This simplifies the production of the laser component.

It has been shown that such a binary diffractive element is particularly suitable in conjunction with a downstream optical element, although, due to symmetry reasons, a binary diffractive optical element itself effects a symmetrical emission with respect to the emission axis.

Furthermore, an optical element configured as a diffractive optical element can have a very low overall height and be used to achieve an efficient beam widening, in particular in the form of several partial beams running obliquely to one another. This allows a particularly compact design of the laser component along the emission axis.

For disturbing the symmetry, especially for tilting the main emission direction relative to the emission axis, a refractive optical element has been proven to be particularly suitable as a further optical element.

The laser component can thus combine the advantages of two optical elements based on different basic physical principles, namely on diffraction on the one hand and on refraction on the other.

Furthermore, the further optical element can encapsulate the optical element so that a particularly high degree of eye-safety can be achieved.

The laser component is therefore particularly suitable for a device where, particularly in the intended use of the device, the radiation of the laser component can strike the human eye, or even for a device where the laser component is provided as a light source for illuminating a face or a face part of a user of the device.

For example, a device comprising such a semiconductor laser has a display component, wherein a main emission direction of the semiconductor laser is oblique to a main extension plane of the display component. The main extension plane of the display component is typically parallel to the main extension plane of the device. For example, the device is a hand-held electronic device, such as a mobile phone or a tablet. During operation of the device, the semiconductor laser can illuminate the user's face at least in regions, for example.

The semiconductor laser is particularly suitable for being used as a light source for the acquisition of biometric data. For example, the semiconductor laser can serve as a light source for face recognition as a security feature in the access control of the device.

The term "light source" is not restricted to visible electromagnetic radiation but also includes radiation in the infrared or ultraviolet spectral range.

It has been shown that when mobile devices such as mobile phones are used, users often hold them in space at a relatively flat angle to the horizontal, so that only a comparatively small proportion of radiation radiated perpendicular to the main plane of extension of the device would hit the face. By means of an obliquely radiating laser component the efficiency of the illumination of the face can be improved in a simple way, without the laser component having to be followed by an optical element or the laser component, especially the active zone, itself having to be oriented obliquely to the main extension plane of the device.

Furthermore, a method for the production of a plurality of laser components is specified.

According to at least one embodiment of the method, a plurality of surface emitting semiconductor lasers having an emission axis and an optical element are provided in a composite. A plurality of further optical elements are assigned to the semiconductor lasers of the composite, wherein the further optical elements are configured to cause an asymmetric emission of the radiation relative to the emission axis of the semiconductor lasers. The composite is singulated into the plurality of laser components, wherein the laser components each comprise a surface-emitting semiconductor laser, an optical element and a further optical element.

According to at least one embodiment of the method, the further optical elements are formed during the assignment to the semiconductor lasers by applying a molding compound onto the composite. The further optical elements are therefore formed directly on the composite and are not assigned to the respective semiconductor lasers as prefabricated elements. For example, the optical elements are formed by a casting process.

A casting process is generally understood to mean a process in which a molding compound can be formed according to a given shape and cured if necessary. In particular, the term "casting" includes molding, film assisted molding, injection molding, transfer molding and compression molding.

According to at least one embodiment of the method, the further optical elements are formed contiguously over the composite and separated during the singulation process. The molding compound can therefore stretch over several or all semiconductor lasers in the composite.

The singulation process can be carried out mechanically, for instance by sawing; chemically, for instance by etching; or by means of coherent radiation, for instance by laser cutting.

The described method is particularly suitable for the production of a laser component described above. Features described in connection with the laser component can therefore also be used for the method, and vice versa.

Further exemplary embodiments and expediencies will become apparent from following description of the exemplary embodiments in connection with the figures.

Figure 1:
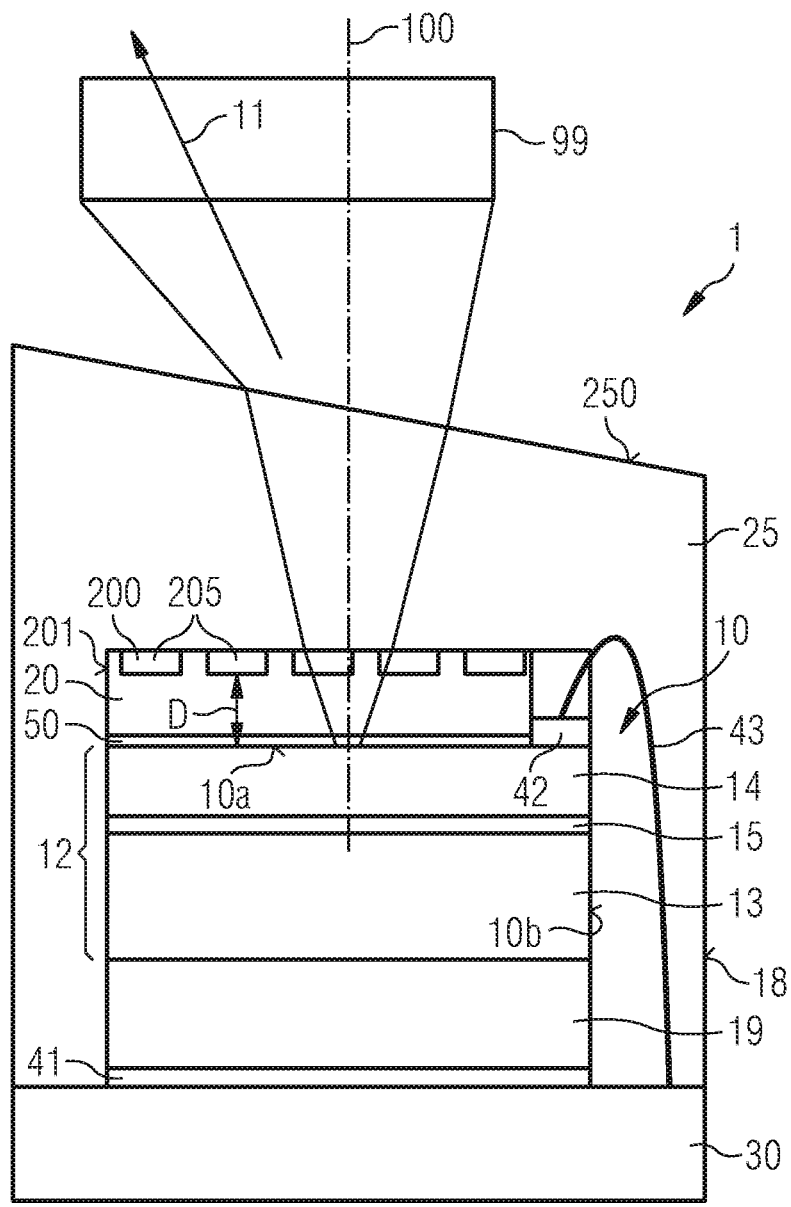
FIG. 1 shows an example of a laser component in a schematic sectional view.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

FIG. 1 shows an exemplary embodiment of a laser component in a schematic sectional view.

The laser component 1 has a surface-emitting semiconductor laser 10 which is configured to emit electromagnetic radiation along an emission axis 100. The semiconductor laser 10 has a semiconductor body 12 having a semiconductor layer sequence, wherein the semiconductor layer sequence is epitaxially deposited, for example. In particular, the semiconductor body 12 has an active zone 15 for generating electromagnetic radiation. The active zone 15 is arranged between a first semiconductor layer 13 and a second semiconductor layer 14, wherein the first semiconductor layer and the second semiconductor layer differ at least in parts from each other with respect to the type of conductor, so that the active zone is located in a pn-junction. The emission axis 100 runs perpendicular to the active zone 15 and in particular also throughout the active zone 15. The semiconductor laser 10, in particular the active zone 15, is configured in particular for generating radiation in the ultraviolet, visible or infrared spectral range.

Along the emission axis 100, an optical element 20 is arranged downstream of the semiconductor laser 10. The optical element 20 has a diffractive structure 200. The diffractive structure 200 comprises elements 205 which, for example, are arranged periodically along a main extension plane of the optical element 20 and in at least one spatial direction transverse to the emission axis 100 have a size in the order of the magnitude of the wavelength range of the emitted electromagnetic radiation. The elements 205, for example, are arranged as recesses in an initial material of the optical element 20, such as a glass. For example, the elements 205 are filled with a gaseous material. The elements 205 are periodically arranged at least along a lateral direction, for example along two mutually perpendicular lateral directions.

For example, the diffractive structure 200 is located at a distance D of at least 20 µm, in particular of at least 25 µm, from a radiation exit surface 10*a* of the semiconductor laser 10. The diffractive structure 200 of the optical element 20 widens the radiation emitted by the semiconductor laser 10 by dividing it into different partial beams. Depending on the size of the field of view 99 to be illuminated, in a lateral and/or in a vertical direction, the periodicity of the diffractive structure 200 and the structure size of the elements 205 can be set in such a way that, in addition to the zero diffraction order of the diffractive structure 200, at least the first diffraction order and possibly further diffraction orders are deflected at an angle to the emission axis 100. In a sectional plane along the emission axis, however, the radiation emerging from the optical element 20 remains axissymmetrical to the emission axis 100.

The laser component 1 also comprises a further optical element 25 which causes an asymmetric emission of the radiation with respect to the emission axis. In particular, a main emission direction 11 of the laser component is oblique to the emission axis 100 of the semiconductor laser 10. For example, the emission axis and the main emission direction form an angle of at least 5°, of at least 10° or of at least 15°. For example, the maximum angle is 60° or 45°.

In the simplest case, a radiation exit surface 250 of the further optical element 25 is arranged obliquely to the emission axis 100, resulting in a main emission direction 11 which is tilted to the emission axis 100. Using a refractive optical element, the symmetry of the radiation with respect to the emission axis can be easily disturbed in a targeted manner. In a section plane running along the main emission direction, the radiation emerging from the further optical element can be axially symmetrical to the main emission direction.

The laser component 1 thus has two optical elements integrated into the laser component, the optical element 20 causing radiation widening and the further optical element 25 causing the main emission direction to tilt with respect to the emission axis 100 of the semiconductor laser. The optical element 20 itself can therefore be configured in such a way that it retains the symmetry of the radiation of the semiconductor laser 10 at least along a section plane. A binary diffractive optical element, therefore, is particularly suitable to act as an optical element 20 which inevitably produces symmetrical emission due to symmetry reasons.

It has been shown that despite the further optical element as an additional optical element, as a whole, the production is simplified, especially compared to the use of a multistage diffractive optical element which itself could cause asymmetric emission.

In the vertical direction, i.e. perpendicular to a main extension plane of the active zone 15, a particularly compact design of laser component 1 can be achieved by means of the diffractive structure. In principle, however, an optical element other than a diffractive optical element can also be used, for example an optical element based on the principle of refraction.

The further optical element 25 is adapted to the optical element 20 and directly adjoins the optical element. The further optical element 25 covers a side surface 201 of the optical element 20 and a side surface 10b of the semiconductor laser and is formed as an encapsulation for the optical element 20 and the semiconductor laser 10. The bonding wire 43 runs completely inside the further optical element 25. By means of the further optical element 25, it is ensured in a simple manner that the optical element 20 itself cannot become detached from the semiconductor laser 10. This results in a particularly high degree of eye-safety for the laser component. The further optical element 25 forms a side surface 18 in places which delimits the laser component 1 in the lateral direction. At the side surface 18, the further optical element may have traces of material removal which is caused by a singulation process during the production of the laser component.

The semiconductor laser 10 has a substrate 19. For example, the substrate is the growth substrate for the semiconductor layer sequence of the semiconductor body 12. The substrate, however, can also be different from the growth substrate. Furthermore, the semiconductor laser 10 has a first contact area 41 and a second contact area 42. By applying an external electrical potential between the first contact area 41 and the second contact area 42, charge carriers from opposite sides can be injected into the active zone 15 and recombine there while emitting radiation. The first contact area 41 and the second contact area 42 are electrically conductively connected to a carrier 30. The first contact area 41 and the second contact area 42 are located on opposite sides of the substrate. The second contact area 42 on the side facing away from the carrier 30 is connected to the carrier by a connection means, for example in the form of a bonding wire 43.

The second contact area 42 is not or at least not completely covered by the optical element 20, so that the second contact area is still accessible for the production of the connection means, even if the optical element 20 is already mounted.

The carrier 30, for example, is a submount or a printed circuit board. The carrier 30 and the further optical element 25 are flush in the lateral direction.

The optical element 20 is connected to the semiconductor laser in a material-locking manner. In a material-locking composite, the preferably prefabricated connection partners are held together by means of atomic and/or molecular forces. A material-locking connection can be achieved, for example, by a connection means, such as an adhesive or a solder. In general, the separation of the connection is accompanied by the destruction of the connection means and/or of at least one of the connection partners.

The optical element 20 is fastened with a connection means 50, such as an adhesive, for example an epoxy or as an example a silicone. Alternatively, direct bonding can also be used to achieve a material-locking connection, for example through hydrogen bonds and/or van der Waals interactions. A connection means is not required in this case.

In the lateral direction, the optical element 20 and the semiconductor laser 10 can be flush at least in places. In this case, a side surface 201 of the optical element 20 and a side surface 10b of the semiconductor laser lie in one plane. In particular during the production of the laser component 1, the optical element 20 can be attached to the semiconductor laser 10 before the semiconductor laser 10 is singulated from its original wafer composite. The original wafer composite may comprise in particular the growth substrate for the semiconductor layer sequence of the semiconductor laser.

The optical element 20, the further optical element 25 and the connection means 50 can have the same or substantially the same refractive index, for example with a deviation of at most 0.2 or at most 0.1. Backscattering at the interfaces within the laser component 1 can thus be reduced as far as possible.

Figure 2A:
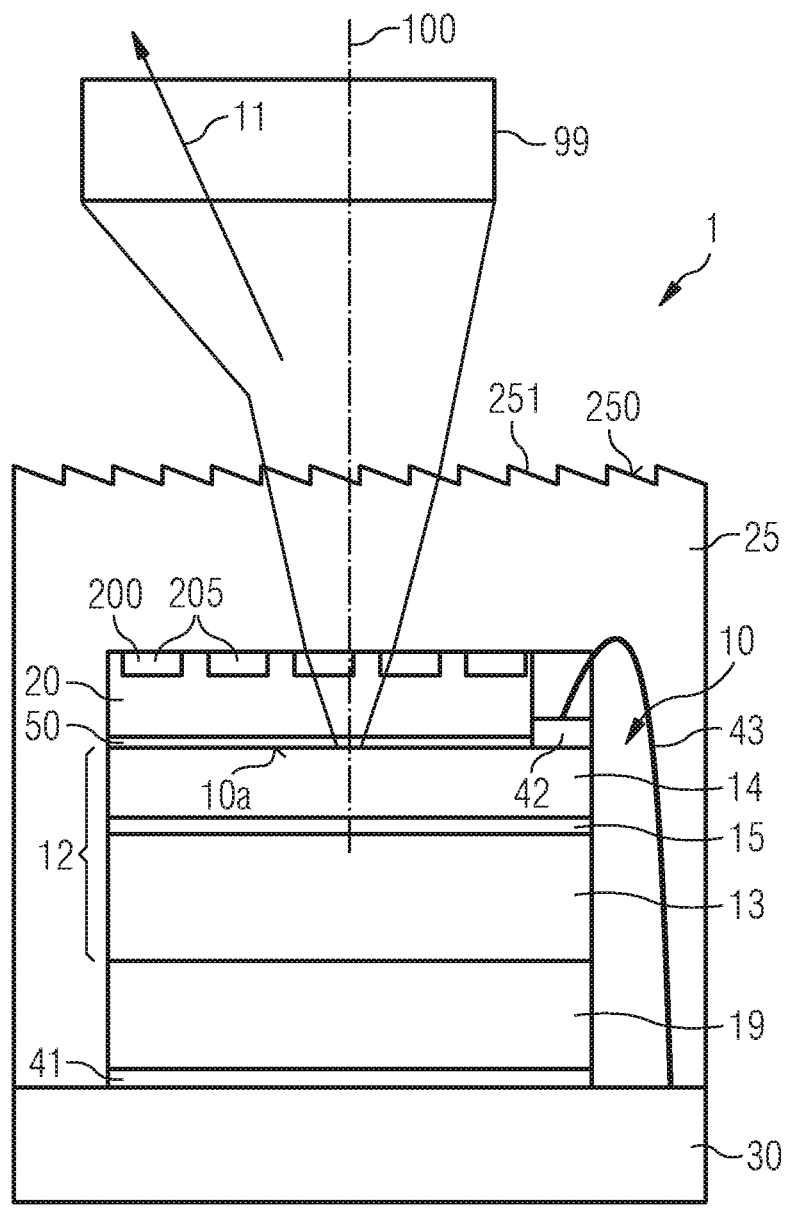
FIG. 2A shows an example of a laser component in a schematic sectional view.
Figure 2B:
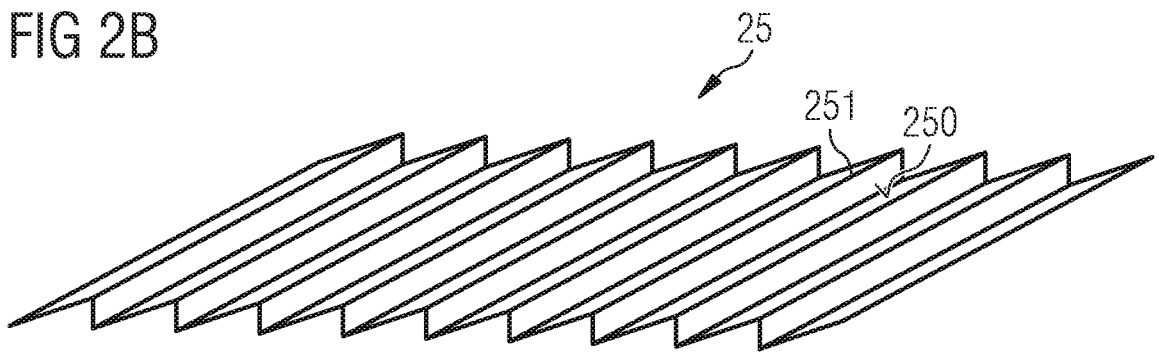
FIG. 2B shows a schematic perspective view of the further optical element according to FIG. 2A.

The exemplary embodiment shown in FIGS. 2A and 2B essentially corresponds to the exemplary embodiment described in FIG. 1.

In contrast to this, the further optical element 25 is formed as a Fresnel optics 251. The radiation exit surface 250 of the further optical element has a saw-tooth-like structuring comprising a plurality of prism-shaped elements arranged next to each other along the lateral direction. The vertical extension of the laser component can be further reduced by means of Fresnel optics.

A schematic perspective view of the radiation exit surface 250 of the further optical element 25 is shown in FIG. 2B. Such an optical element causes the incident radiation to be tilted along a spatial direction, while the radiation distribution in a direction perpendicular to it is not significantly changed.

Figure 3:
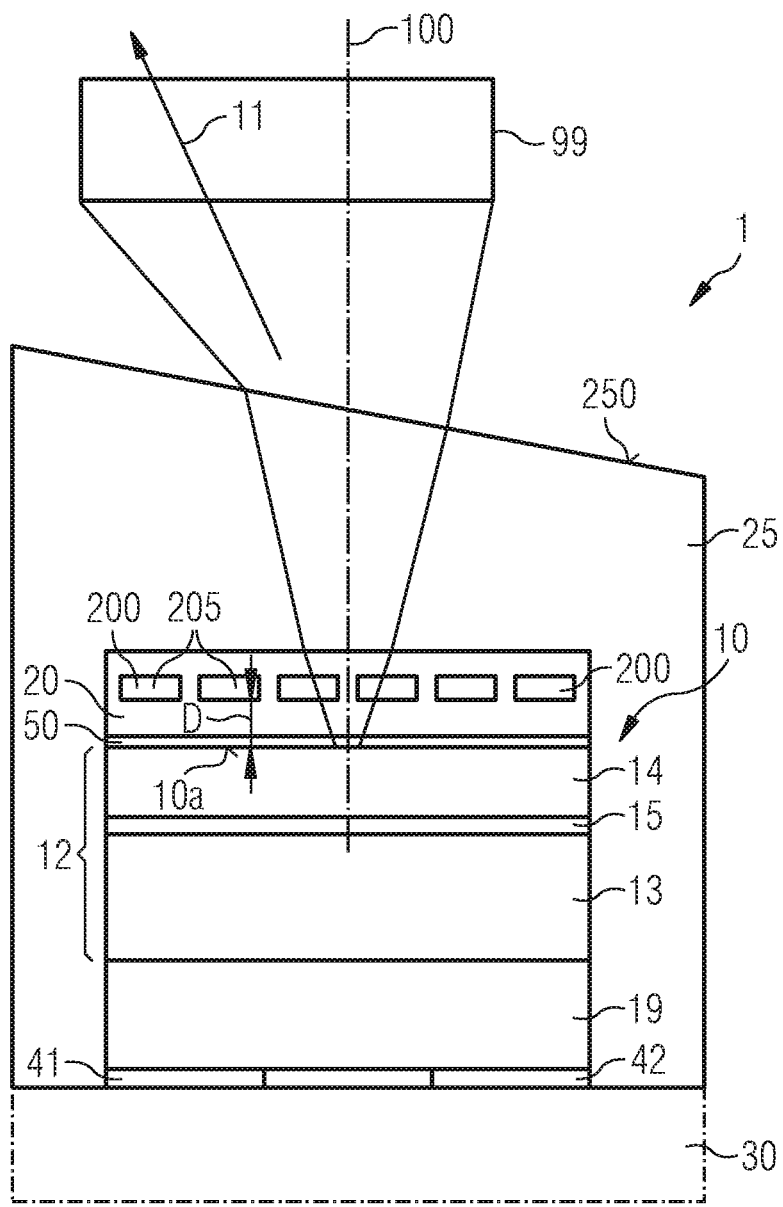
FIGS. 3 and 4 show an example of a laser component in a schematic sectional view.

The exemplary embodiment shown in FIG. 3 essentially corresponds to the exemplary embodiment described in connection with FIG. 1.

In contrast, the semiconductor laser 10 has the first contact area 41 and the second contact area 42 on the side facing away from the radiation exit surface 10a of the semiconductor laser. Thus, the semiconductor laser 10 provides two contacts on its rear side for the electrical connection.

The carrier 30 shown with a dashed line is optional and can also be omitted. In this case, the first contact area 41 and the second contact area 42 are accessible for an external electrical contacting of laser component 1.

Furthermore, in contrast to the exemplary embodiment described in FIG. 1, the optical element 20 is configured in such a way that the diffractive structure 200 is arranged within the optical element. In other words, the diffractive structure 200 is spatially spaced from both a rear side of the optical element facing the semiconductor laser and a front side of the optical element facing away from the semiconductor laser. The front side and/or the rear side of the optical element 20 can be planar. Of course, such an optical element is also suitable for the remaining exemplary embodiments.

Figure 4:
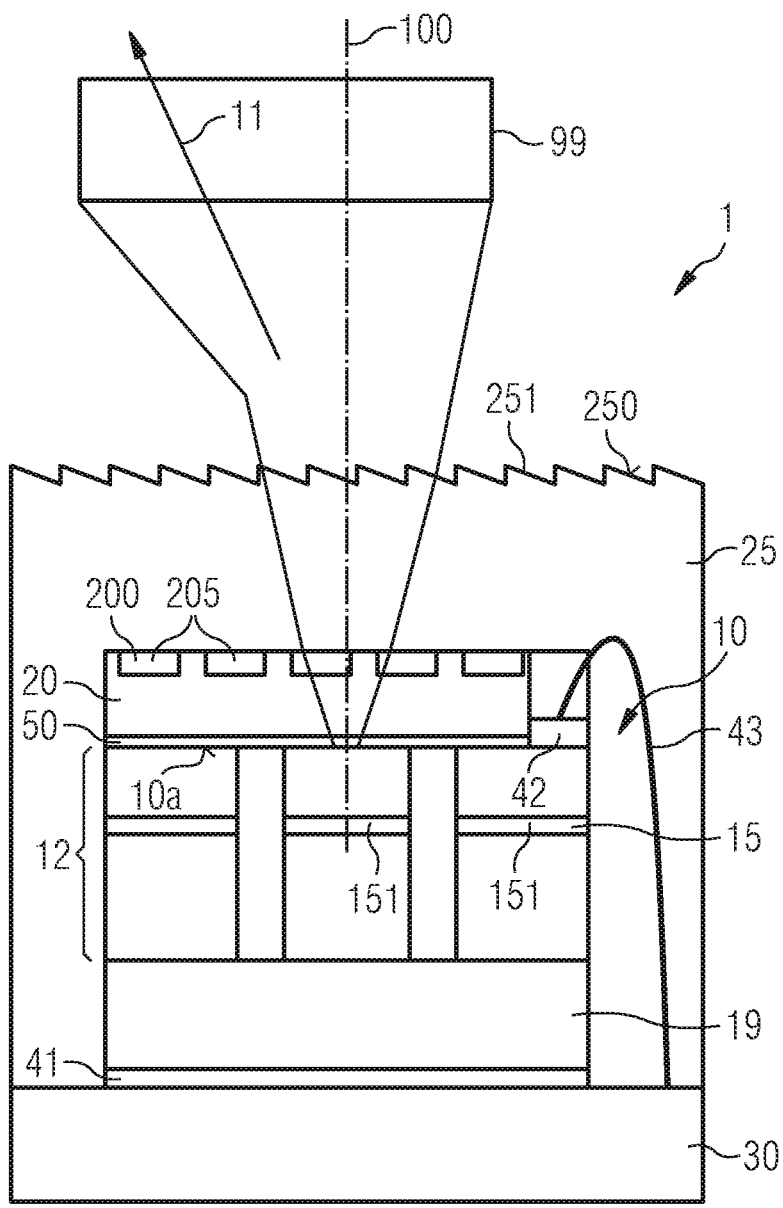

FIG. 4 shows a further exemplary embodiment of a laser component. This exemplary embodiment corresponds essentially to the exemplary embodiment described in connection with FIGS. 2A and 2B. In contrast, the active zone 15 is divided into a plurality of segments 151. In particular, each segment 151 can be assigned to its own second contact area 42, so that the segments can be controlled independently from each other during operation of the semiconductor laser. For a simplified illustration, FIG. 4 only shows an associated second contact area 42 for one segment 151.

The optical element 20 can extend over at least two adjacent segments 151 or over all segments of the semiconductor laser 10. In a plan view of the laser component 1, the further optical element 25 covers all segments 151 of the active zone 15.

Figure 5:
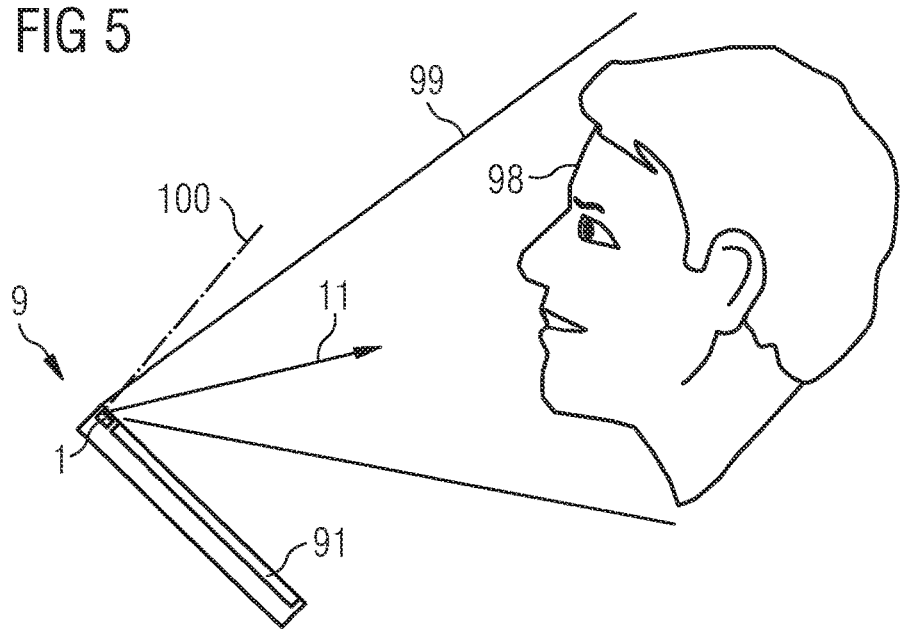
FIG. 5 shows an example of a device having a laser component.

FIG. 5 shows an exemplary embodiment of a device 9 comprising a laser component 1 described above. The device is, for example, a hand-held mobile electronic device such as a mobile phone or tablet.

The device 9 has a display component 91. An emission axis 100 of the semiconductor laser 10 is perpendicular to a main extension plane of the display component 91 and of the device 9. Accordingly, the main emission direction 11 is oblique to the emission axis 100 and thus oblique to a normal to the display component 91. In a simplified manner, a user's face 98 can be located in the field of view 99 of the laser component 1 even if the user holds the device in such a way that the normal to the display component 91 does not point centrally to the face. This is the case, for example, when the user holds the device 9 comparatively flat to a horizontal line in space.

In this way a reliable illumination of the face can be achieved by means of the laser component 1, without the need to place a deflecting optical element downstream of the laser component or to mount the active zone of the laser component 1 obliquely to the display component 91.

The laser component 1 is therefore particularly suitable for being used as a light source for the acquisition of biometric data, for example for face recognition as a security feature for access control to the device.

Of course, the laser component, however, is also suitable for other devices, such as devices without a display component and non-hand-held devices, in which an oblique radiation with regard to a mounting plane is desired.

Figure 6A:
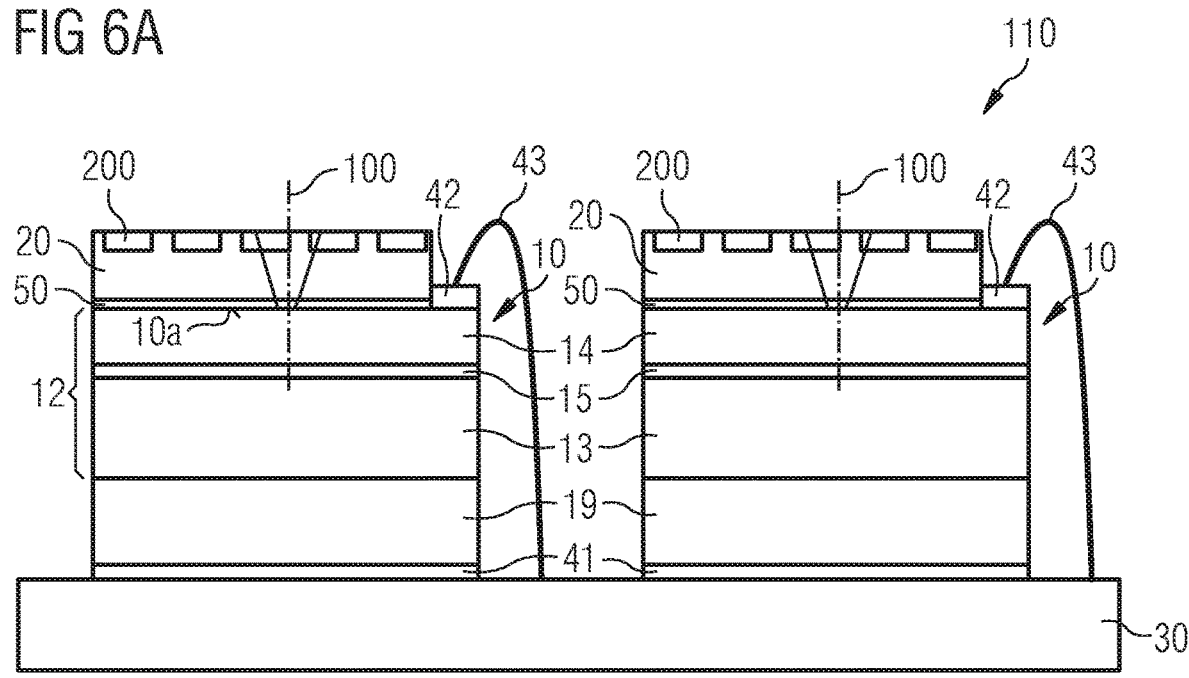
FIGS. 6A, 6B and 6C show an exemplary embodiment for a method for the production of laser components by means of intermediate steps shown in a schematic sectional view.
Figure 6B:
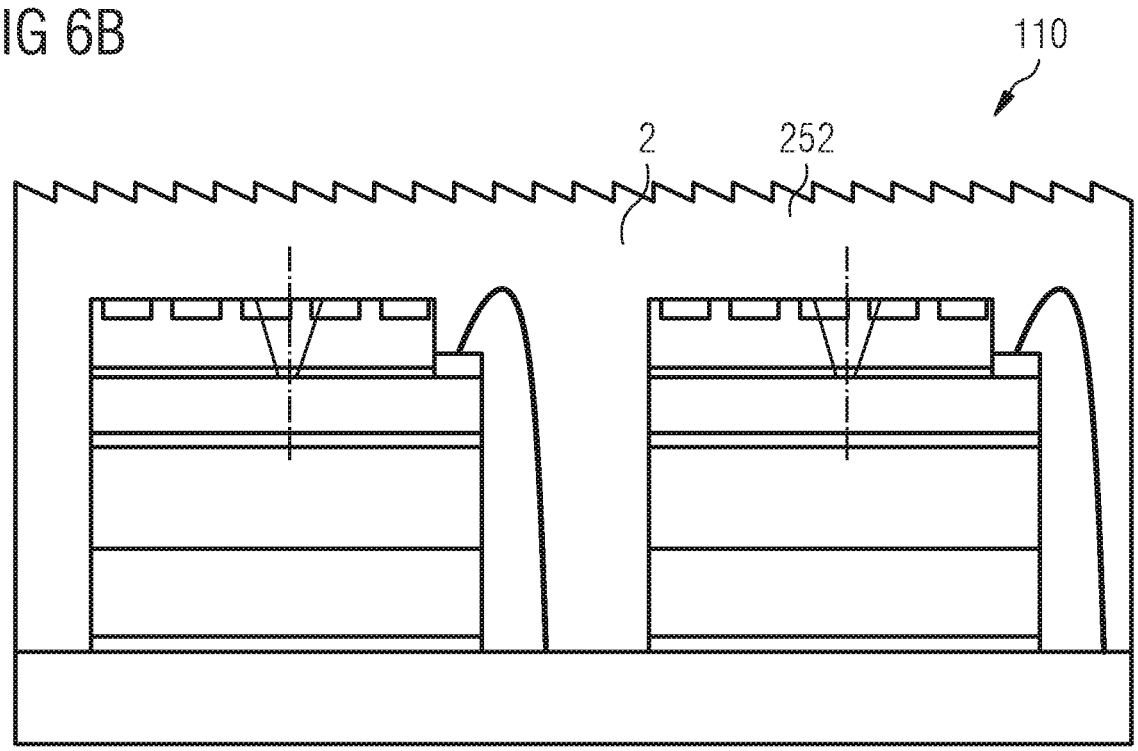
Figure 6C:
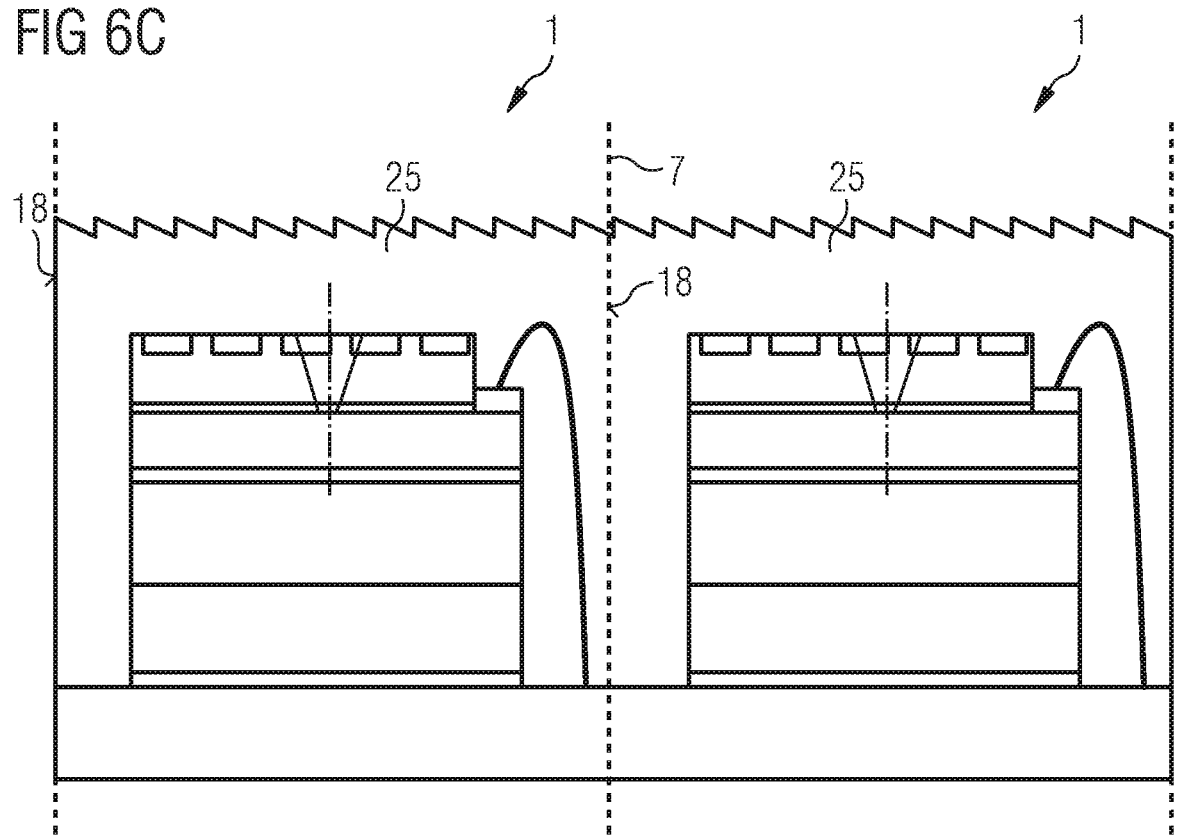

An exemplary embodiment for a process for producing laser components is shown in FIGS. 6A to 6C, wherein as an example, a laser component 1 as described in connection with FIG. 2 is produced.

A plurality of surface-emitting semiconductor lasers 10, each having an emission axis 100 and an optical element 20, are provided in a composite of 110. For example, the semiconductor lasers 10 are arranged on a common carrier 30.

Each of the semiconductor lasers of the composite (FIG. 6B) is then assigned to a further optical element 25. For this purpose, the further optical elements 25 can be formed by applying a molding compound 252. Hence, the further optical elements 25 are not prefabricated optical elements that are subsequently attached to the semiconductor lasers 10. The molding compound 252 can also be used to encapsulate the semiconductor lasers 10 and the optical elements 20.

Finally, as shown in FIG. 6C, the composite 110 can be singulated along singulation lines 7 between the adjacent semiconductor lasers 20. For example, a mechanical process, such as sawing, a chemical process, such as etching, or a process using coherent radiation, such as a laser cutting process, is suitable for this purpose. During singulation along the singulation line 7, the side surfaces 18 of the laser components to be produced are formed, wherein the carrier 30 and the further optical element 25 of a semiconductor laser are flush in the lateral direction.

As an alternative to the exemplary embodiment described above, the carrier 30 can also be a temporary intermediate carrier which is removed after the further optical element 25 has been formed. This makes it possible to provide a laser component 1 that provides at least two contact areas on its rear side for an external electrical connection (see FIG. 3).

The present application claims the priority of German patent application DE 10 2017 119 778.8, the disclosure content of which is hereby included by reference.

The invention is not restricted to the description made with reference to exemplary embodiments. The invention rather comprises any novel feature and any combination of features, including in particular any combination of features in the claims, even if this feature or this combination is not itself explicitly indicated in the patent claims or in the exemplary embodiments.

REFERENCE CHARACTER LIST

1 Laser component
10 Semiconductor laser
10a Radiation exit surface of the semiconductor laser
10b Side surface of the semiconductor laser
100 Emission axis
110 Composite
11 Main emission direction
12 Semiconductor body
13 First semiconductor layer
14 Second semiconductor layer
15 Active zone
151 Segment
18 Side surface
19 Substrate
20 Optical element
200 Diffractive structure
201 Side surface of the optical element
205 Element
25 Further optical element
250 Radiation exit surface
251 Fresnel optics
252 Molding compound
30 Carrier
41 First contact area
42 Second contact area
43 Bonding wire
50 Connection means
7 Singulation line
9 Device 91 Display component
98 Face
99 Field of view
D Distance of the diffractive structure to the radiation exit surface of the semiconductor laser

The invention claimed is:

1. A method for producing a plurality of laser components, comprising the following method steps:
   a) providing a plurality of surface emitting semiconductor lasers having an emission axis and an optical element in a composite;
   b) assigning a plurality of further optical elements to the semiconductor lasers of the composite, the further optical elements being configured to effect an asymmetric emission of the radiation relative to the emission axis of the semiconductor lasers; and
   c) singulating the composite into the plurality of laser components, the laser components each comprising a surface-emitting semiconductor laser, an optical element and a further optical element.

2. The method according to claim 1, wherein in step b, the further optical elements are formed by applying a molding compound to the composite.

3. The method according to claim 1, wherein the further optical elements are formed in a continuous manner over the composite and are severed during singulation.

4. The method according to claim 1, wherein a laser component is produced which comprises:
   a surface emitting semiconductor laser configured for emitting electromagnetic radiation along an emission axis;
   an optical element disposed downstream of the semiconductor laser along the emission axis, wherein the optical element comprises a diffractive structure; and
   a further optical element configured to cause radiation to be emitted asymmetrically with respect to the emission axis.

5. A laser component comprising:
   a surface emitting semiconductor laser configured for emitting electromagnetic radiation along an emission axis;
   an optical element disposed downstream of the semiconductor laser along the emission axis, wherein the optical element comprises a diffractive structure; and
   a further optical element configured to cause radiation to be emitted asymmetrically with respect to the emission axis, wherein the further optical element directly adjoins a side surface of the surface emitting semiconductor laser.

6. The laser component according to claim 5, wherein a main radiation direction of the laser component is oblique to the emission axis of the semiconductor laser.

7. The laser component according to claim 5, wherein the further optical element is arranged downstream of the optical element along the emission axis.

8. The laser component according to claim 5, wherein the further optical element partially covers the side surface of the surface emitting semiconductor laser.

9. The laser component according to claim 5, wherein the further optical element forms a side surface delimiting the laser component in the lateral direction.

10. The laser component according to claim 9, wherein the further optical element has traces of material removal on the side surface of the laser component.

11. The laser component according to claim 5, wherein the further optical element directly adjoins the optical element.

12. The laser component according to claim 5, wherein the optical element is a binary diffractive optical element.

13. The laser component according to claim 5, wherein a radiation exit surface of the further optical element facing away from the optical element is at least partially formed by a planar surface extending obliquely to the emission axis of the semiconductor laser.

14. The laser component according to claim 5, wherein the further optical element is formed as Fresnel optics.

15. A device having a laser component according to claim 5.

16. The device according to claim 15, wherein the device comprises a display component and a main radiation direction of the semiconductor laser is oblique to a main extension plane of the display component.

17. The laser component according to claim 5 being a light source for the acquisition of biometric data.

18. The laser component according to claim 5, wherein the further optical element is formed in one piece and direct adjoins a side surface of the optical element.

* * * * *